(12) United States Patent
Shulman (10) Patent No.: US 6,304,128 B1
(45) Date of Patent: *Oct. 16, 2001

(54) CONTINUOUS TIME CAPACITOR-TUNER INTEGRATOR

(75) Inventor: Dima David Shulman, Marlboro, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/501,752

(22) Filed: Feb. 10, 2000

Related U.S. Application Data

(63) Continuation of application No. 08/949,170, filed on Oct. 10, 1997, now Pat. No. 6,060,935.

(51) Int. Cl.[7] ........................................... H03K 5/00

(52) U.S. Cl. .................... 327/345; 327/344; 327/336; 327/553; 327/558; 327/562

(58) Field of Search ..................... 327/552, 553, 327/558, 345, 336, 344, 362, 361, 554

(56) References Cited

U.S. PATENT DOCUMENTS

| 3,831,117 | 8/1974 | Fletcher et al. ............... 330/80 R |
| 5,235,223 | 8/1993 | Maple ............................ 327/558 |
| 5,945,874 | * 8/1999 | Punzengerger et al. ........ 327/558 |
| 6,060,935 | * 5/2000 | Shulman ........................ 327/553 |

OTHER PUBLICATIONS

Design of Analog Filters, Passive, Active RC, and Switched Capacitor–Rolf Schaumann et al., (1990) pp. 222–229. 1997 IEEE International Solid–State Circuits Conference Digest of Technical Papers—Ian A. Young et al.—(Feb. 1977) pp. 156–157.

Design of a Low–Distortion 22–kHz Fifth–Order Bessel Filter—Un–Ku Moon et al.—vol.28 No. 12 (12/93) pp. 1254–1263.

IEEE Transactions on Circuits and Systems, On the Stability of the Phase–Lead Integrator—Ken Martin et al.—(6/77)—vol. Cas–24, No. 6. pp. 321–324.

IEEE Transactions on Circuit Theory—vol. CT–16—(8/69) pp. 406–408.

Electronics Engineers' Handbook (Filters and Attenuators) pp. 12–42–12–57 (1989).

IEEE Journal of Solid–State Circuits (6/78), pp. 383–391.

Design with Operational Amplifiers and Analog Integrated Circuits, Mc–Graw Hill, NY (1988) pp. ?.

Design of Analog Integrated Circuits and Systems—K.R. Laker & W. Sansen, McGraw–Hill, (1994), pp. 438–443.

* cited by examiner

Primary Examiner—Dinh T. Le
(74) Attorney, Agent, or Firm—Darby & Darby (57) ABSTRACT

A tunable integrator circuit having a main amplifier with an input resistor R and a feedback capacitor C and a tuning amplifier having a variable gain k between the output of the main amplifier and the feedback capacitor. The circuit has an effective capacitance of kC. Thus the integrator can be tuned to compensate for temperature and processing variations of the RC product by adjusting the gain of the tuning amplifier. The tuning amplifier can also be used to multiply the effective capacitance of the filter, kC, by increasing the gain k of the tuning amplifier beyond that needed to compensate for RC variations, thus reducing the area required for on-chip capacitances while maintaining a constant resistance. The circuit can be used independently or in conjunction with a capacitor array.

9 Claims, 8 Drawing Sheets

CONTINUOUS TIME CAPACITOR-TUNER INTEGRATOR

This is a continuation, of application Ser. No. 08/949,170, filed Oct. 10, 1997 now U.S. Pat. No. 6,060,935. Each of these prior applications is hereby incorporated herein by reference, in its entirety.

TECHNICAL FIELD

This invention is related to an article comprising a continuous time capacitor-tuner integrator. More particularly, this invention relates to a continuous time capacitor-tuner integrator used to adjust the capacitance and thus the RC product of a continuous time filter.

BACKGROUND OF THE INVENTION

Continuous-time filters have become widely used in commercial applications. Currently, this area is dominated by transconductor-capacitor (gm-C) filters. However, in low and medium frequency applications the active RC filters feature higher dynamic range and lower distortion. Active RC filters are constructed from resistors, capacitors, and integrated amplifiers. A basic building block is an integrator comprising an op-amp with an input resistor and a feedback capacitor. For low to medium frequency applications, the amplifiers can be treated as having essentially infinite gain and input impedance. Because little or no current is drawn by the amplifiers, the amplifier inputs function as virtual grounds and substantially all of the input signal is applied to the resistors and capacitors. Thus, the operating characteristics of the filter are determined by the various RC products.

In some situations, it has proven useful to provide a feedback amplifier in series with a compensating feedback capacitor. For example, a unity gain amplifier placed in the feedback path has been used to improve stability of MOS amplifier circuits. Y. P. Tsividis, "Single-Channel MOS Analog IC's," IEEE Journal of Solid-State Circuits, Vol. SC-13, No. 3, pp. 389–90, June 1978. A non-tunable amplifier with gain less than or equal to 1 has also been used in phase-lead integrators to cancel out "errors" in the quality factor. Q. K. Martin and A. S. Sedra, "On the Stability of the Phase-Lead Integrator," IEEE Trans. Circuits Syst., Vol. CAS-24, pp. 321–324, June 1977. According to theory, making the unity-gain bandwidth of the main and feedback amplifiers identical results in a value of Q which approaches infinity. Thus, attempts to improve Q in this manner used matched circuits for the main and feedback amplifiers. In practice, however, non-ideal aspects of the circuits cause the integrator to oscillate.

Another drawback to using active integrated RC filters is the variation of the RC product of up to +/−50% from its nominal value due to process and temperature variations. Tuning of the frequency response of the filter to compensate for this variation remains the main problem in VLSI implementation. Although, as discussed above, feedback amplifiers have been used to improve performance, they have not been used to achieve a tunable filter. Instead, there are three conventional approaches to implementing monolithic active RC filters: MOSFET-C, R-MOSFET-C, and R-C Array. In MOSFET-C filters, the resistors are replaced by MOSFETS devices that can be tuned via gate terminals. The R-MOSFET-C approach improves linearity of the MOSFET-C technique by inserting resistors in series with the MOSFETS. However, this technique also degrades the noise performance of the filter. The third approach, R-C Array, achieves the highest dynamic range reported so far by using resistors and replacing capacitors with capacitor arrays which are tuned with a digital signal whose value is set during an initial tuning cycle. A filter using capacitor arrays is especially useful in low-noise high-linearity applications.

However, the major disadvantage with the capacitor array approach is that the capacitor arrays require significant area. This is becoming more important with advances in silicon technology. As the active areas of the transistors decrease, the area required to fabricate the active circuits such as amplifiers and bias circuits shrink. However, there has been little improvement in on-chip capacitor density. As a result, the area of continuous time filters is increasingly dominated by the capacitance size. Another disadvantage of the capacitor array approach is that a filter utilizing capacitor arrays cannot operate while it is being tuned.

SUMMARY OF THE INVENTION

According to the present invention, an analog tuned capacitor integrator is provided which comprises an integrator having a tuning amplifier with variable gain k connected to the output of a main amplifier and driving a capacitor, with capacitance C, connected to an input of the main amplifier. This creates a feedback path with an effective capacitance of kC. An input resistor with resistance R is also connected to the input of the main amplifier. Since the filtering characteristics of the integrator are determined by the RC product of the circuit, here equal to kRC, the effective capacitance, and thus frequency response of the filter, is tuned by changing the gain of the tuning amplifier. As compared to the R-C array approach, this technique offers area savings with a marginal increase in noise. Process variations of the RC products of +/−50% can be easily accommodated by changing the gain k in the range of 0.5 to 1.5. This configuration can also be used to multiply the effective capacitance of the filter, kC, by increasing the gain k of the tuning amplifier beyond that needed to compensate for RC variations, thus allowing substantially smaller physical capacitors to be used in the circuit. This reduces the area required for on-chip capacitances while maintaining a constant resistance. This is especially useful in low frequency applications where the capacitances are typically large.

According to the present invention, and contrary to the prior art, the tuning amplifier is not configured as a unity gain amplifier, nor is it designed to be identical to the main amplifier or have the same bandwidth. Instead, the main and feedback amplifiers are different from one another, and in particular, the tuning amplifier has a greater bandwidth than the main amplifier. The circuit remains stable, even as k is varied, so long as bandwidth of the tuning amplifier is greater than that of the main amplifier. This is not a major design limitation because the tuning amplifier drives only a capacitive load and its own internal resistances. Thus, it can have a simpler design than the main amplifier, and therefore will typically have a greater bandwidth and higher unity gain frequency.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENT(s)

Figure 1:
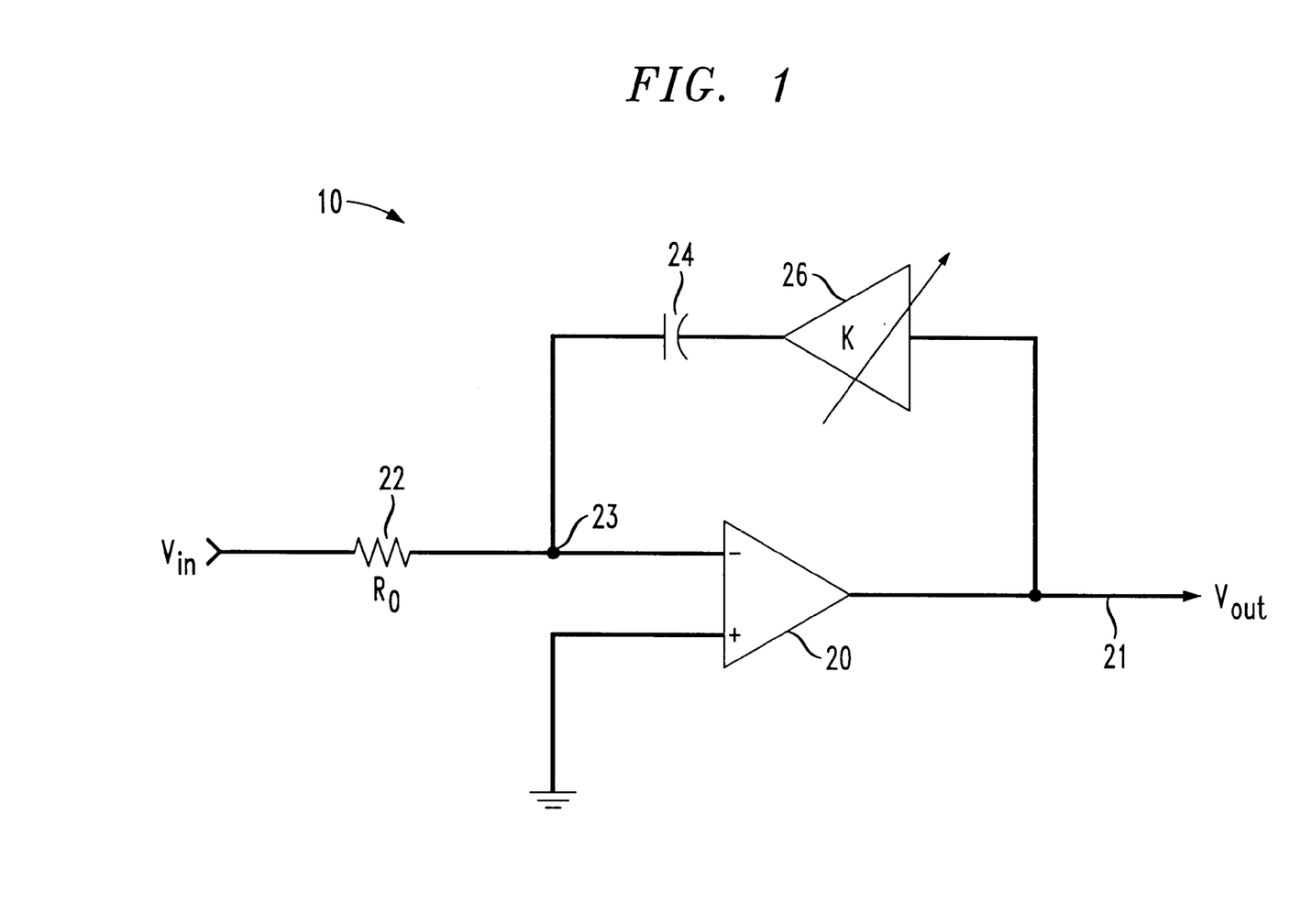
FIG. 1 is a schematic diagram of one embodiment of a capacitor-tuner integrator according to the present invention.

FIG. 1 is a schematic diagram of one embodiment of a capacitor-tuner integrator 10 according to the present invention which comprises a main amplifier 20 having an input resistor 22 (also referred to as $R_0$) connecting $V_{in}$ to inverting input 23 and a feedback loop comprising a tuning amplifier 26 which is driven by the output $V_{out}$ 21 of the main amplifier 20 and a capacitor 24 having capacitance C and connected between the output of the tuning amplifier 26 and an input 23 of the main amplifier 20. The ideal operation of the tunable integrator is described by:

$$V_{out} = -\frac{1}{skR_0C} V_{in} \quad \text{(Equ. 1)}$$

where k is the gain of the tuning amplifier 26. The value of the effective capacitance in the filter, kC, can be tuned by changing k. Process variations of +/−50% in the RC product can be easily accommodated by providing a tuning amplifier with a variable gain in the range of 0.5 to 1.5.

This configuration can also advantageously be used to provide a tunable capacitor multiply. The effective capacitance of the filter, kC, is increased by increasing the gain k of the tuning amplifier beyond that need to compensate for RC product variations. This allows substantially smaller physical capacitors to be used in the circuit, thus reducing the area required for on-chip capacitances while maintaining a constant input resistance. For low frequency applications, this is especially useful since low frequency filters typically require a capacitance which is too large to economically integrate on a chip, e.g., on the order of 1000 pf. According to the present invention, a tuning amplifier with a gain of 5, for example, gives an effective capacitance of 1000 pf with a physical capacitor of only 200 pf, small enough to be integrated onto a chip.

It should be noted that the multiplication factor is limited due to stability and output swing requirements. Stability is discussed below. The output swing requirements present an upper limit for the multiplication factor. In the filter optimized for maximum dynamic range, the gain is essentially shifted to the first stage, and the outputs of different stages are designed to peak at the same level. Because of this, the multiplication factor is determined by the filter output swing requirement and the available output swing of the tuning amplifier. However, the situation is different in low distortion filters, where some gain distribution is necessary to avoid clipping in the presence of strong interferers. Here, each stage should be assigned its own multiplication factor so that the tuning amplifiers will not be clipped.

Figure 2:
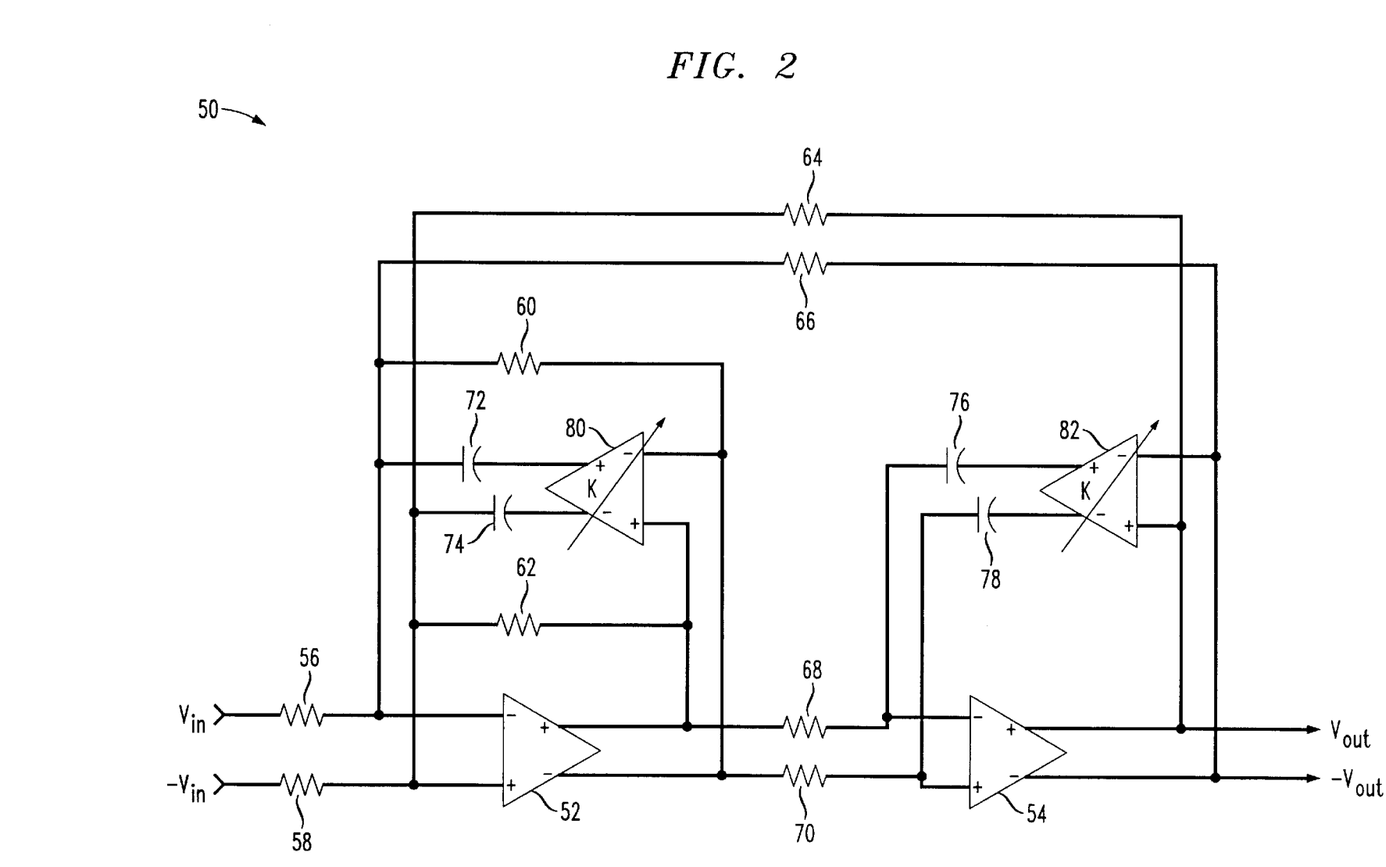
FIG. 2 is a schematic diagram of a Tow-Thomas biquad amplifier which is tunable according to the present invention.

The capacitor-tuner integrator 10 shown in FIG. 1 can be easily adapted to more complex amplifier circuits. For example, FIG. 2 is a schematic diagram of a Tow-Thomas biquad amplifier 50 which is tunable according to the present invention. The amplifier 50 comprises op-amps 52 and 54, resistors 56–70 and feedback capacitors 72, 74, 76 and 78. As shown, the feedback capacitors 72 and 74 are tuned by tuning amplifier 80 which is connected to the output of op-amp 52. Similarly, feedback capacitors 76 and 78 are tuned by tuning amplifier 82 connected to the output of op-amp 54.

As shown in FIGS. 1 and 2, the main amplifier(s) must drive resistive loads. Thus, a two stage amplifier or buffered single stage amplifier is typically required. In contrast, a tuning amplifier drives only a capacitive load (and its internal resistance) and can therefore be made simpler than the main amplifier, i.e. single stage. As a result, it is relatively easy to design the tuning amplifier with a higher bandwidth than the main amplifier so that the circuit is stable, as discussed below. As will be recognized by those skilled in the art, when designing a low-pass filter, the input stage of the tuning amplifier can be considerably smaller than the main amplifier. This is because the contribution of the 1/f noise from the tuning amplifier is attenuated by the capacitance in series with it. Because of the small size of the input stage, the input capacitance of the amplifier can be small, further increasing stability of the integrator.

Figure 3A:
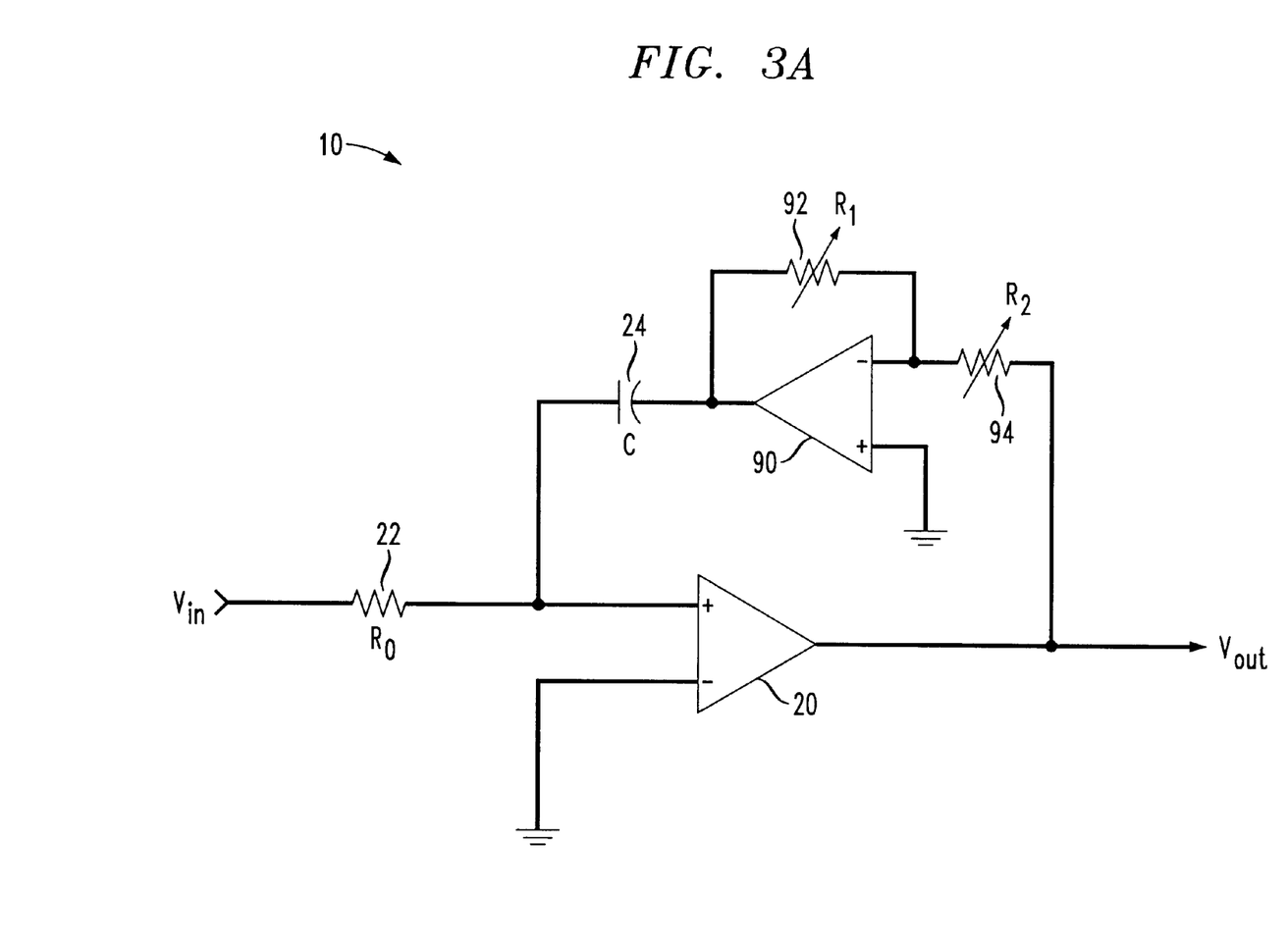
FIG. 3a is a schematic diagram of the circuit of FIG. 1 showing one embodiment of a variable-gain tuning amplifier.

There are various ways in which the tuning amplifier 26 may be configured. One arrangement for the circuit of FIG. 1 is shown in FIG. 3a. The tuning amplifier 26 comprises an op-amp 90 having a variable feedback resistance 92 ($R_1$) and a variable input resistance 94 ($R_2$). The gain k of the tuning amplifier 26 is therefore $R_1/R_2$ and can be varied by adjusting the resistance of either or both of resistors $R_1$ and $R_2$.

Figure 3B:
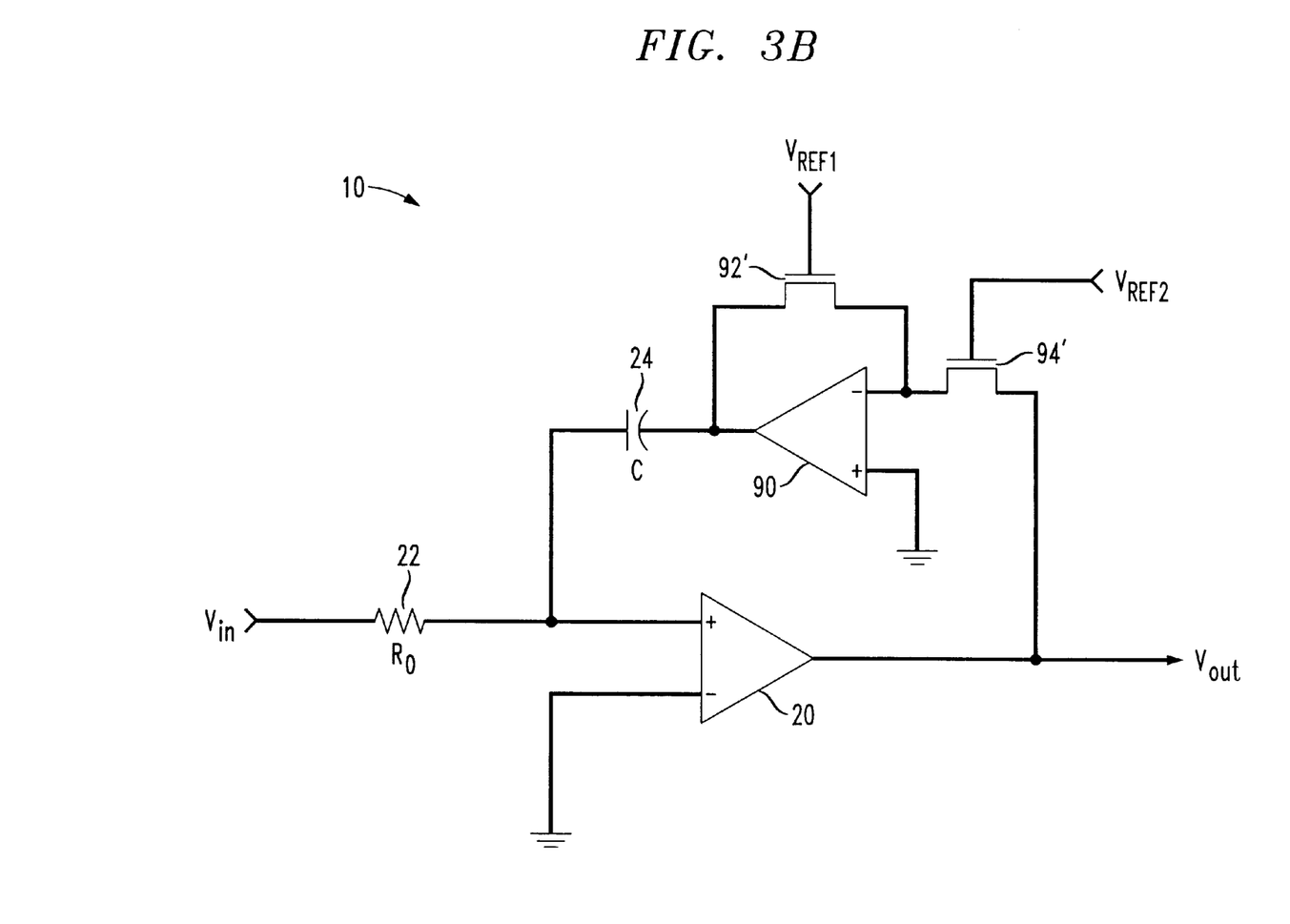
FIG. 3b is the circuit of FIG. 3a with an electronically tunable tuning amplifier.

There are many ways to implement resistors $R_1$ and $R_2$ so that their resistance can be varied to tune the filter, as will be apparent to those of skill in the art. The gain of the tuning amplifier 26 can be electronically controlled by forming one or both of the tuning resistors from active components sucyh as MOS transistors 92', 94', as shown in FIG. 3b, and varying the bias voltages $V_{ref1}$ and $V_{ref2}$. The desired gate voltages $V_{ref1}$ and $V_{ref2}$ can be set by any number of conventional techniques. For example, using conventional feedback techniques, the gate voltage applied a MOS resistor can be adjusted so that the resistance of the MOS device equals the resistance of a known reference resistor. Alternatively, the resistors can be tuned directly by the user if non-integrated devices, such as potentiometers, are used.

In a preferred embodiment, only resistor $R_1$ is variable. In a more preferred embodiment, the circuit is integrated, $R_1$ is variable, and resistors $R_0$ and $R_2$ are formed from the same material and during the same process. In this situation, resistors $R_0$ and $R_2$ will be subject to the same process and temperature variations and the relative effect of these variations will cancel out. Thus, resistor $R_2$ can be defined as having resistance $aR_0$, where a is a constant. The gain of the tuning amplifier 26 is then $k=R_1/aR_0$. Substituting into Equation 1, above, results in:

$$V_{out} = -\frac{a}{sR_1C}V_{in} \qquad \text{(Equ. 2)}$$

Thus, the effective capacitance of the filter can be varied by adjusting the resistance of $R_1$.

Figure 4:
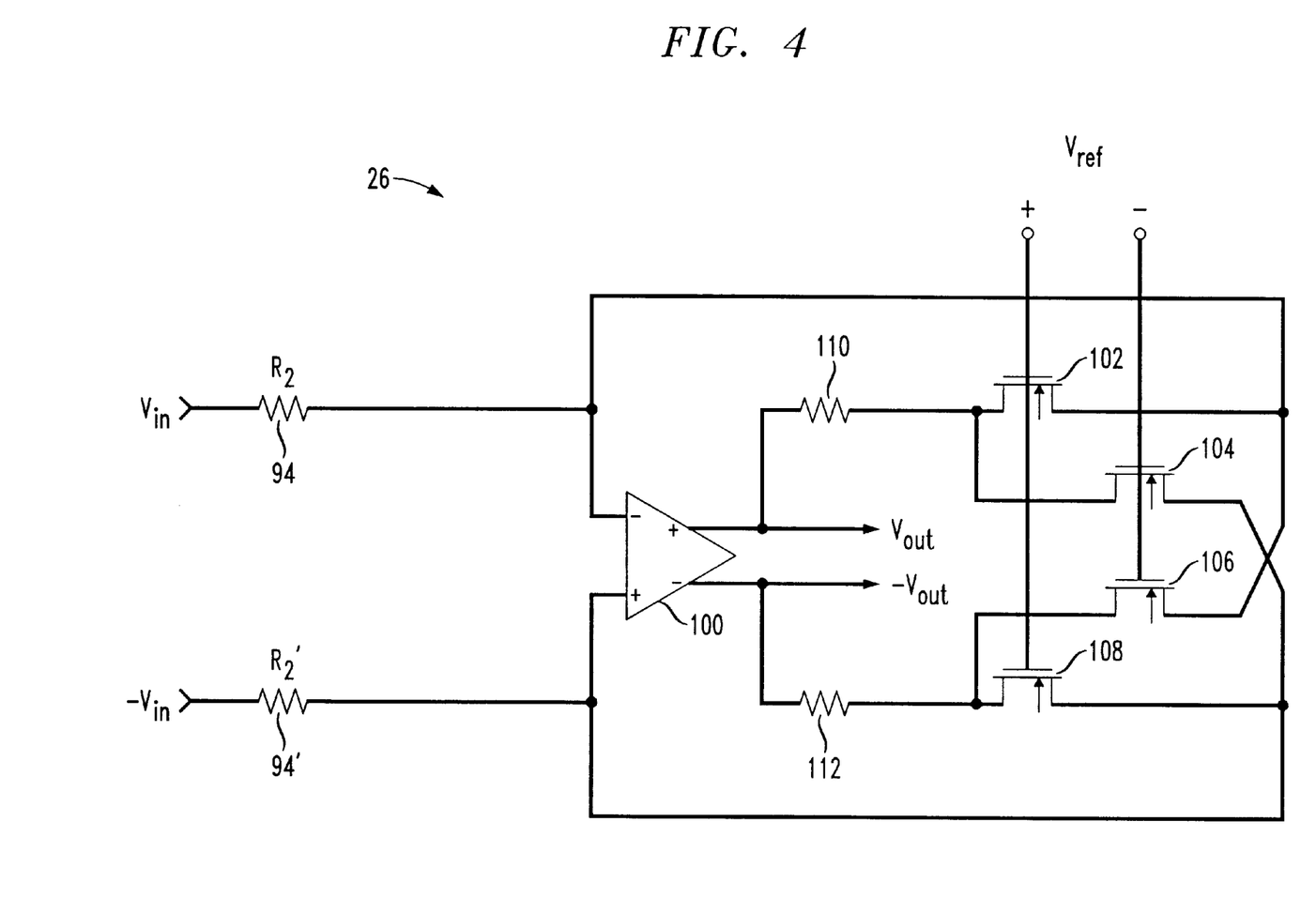
FIG. 4 is a schematic diagram of a one embodiment of a differential variable-gain tuning amplifier to be used in the present invention.

It is advantageous that the tuning amplifier 26 have a linear response to minimize signal distortions in the filter. In a preferred arrangement, a highly linear and highly tunable amplifier 26 is provided by using Moon's multiplier technique as described by U. K. Moon and B. S. Song in "Design of a Low-Distortion 22-KHz Fifth-Order Bessel Filter," IEEE J. Solid-State Circuits, Vol. 28, pp. 1254–1263, December 1993. A differential tuning amplifier 26 configured using a modified version of Moon's technique is illustrated in FIG. 4. The circuit has input resistors 94, 94' connected to op-amp 100. Resistors 94, 94' correspond to a non-variable version of resistor $R_2$ in FIG. 3a, discussed above. The output of the op-amp 100 drives a cross-connected feedback loop comprising resistors 110, 112 and MOS transistors 102, 104, 106, and 108. The impedances of the MOS transistors 102–108, and thus the gain of the tuning amplifier, is set by a reference voltage, $V_{ref}$.

Those skilled in the art will recognize that other configurations for the tuning amplifier 26 may also be used in accordance with various design considerations. For example, when low voltage supplies are used, a closed-loop op-amp configuration may be undesirable. Instead, the tuning amplifier 26 may be an open-loop amplifier comprising a differential input stage (and a buffer stage if needed) can be used. The gain is controlled by adjusting the biasing of one or more transistors in the amplifier. Because open-loop amplifiers do not require switches or gate-controlled devices, they can operate at lower voltages than closed-loop amplifiers. Further, they generally consume less power and have a larger bandwidth than an op-amp based tuning amplifier discussed above. A drawback, however, is that open-loop amplifiers trade linearity for more convenient tuning.

Figure 5:
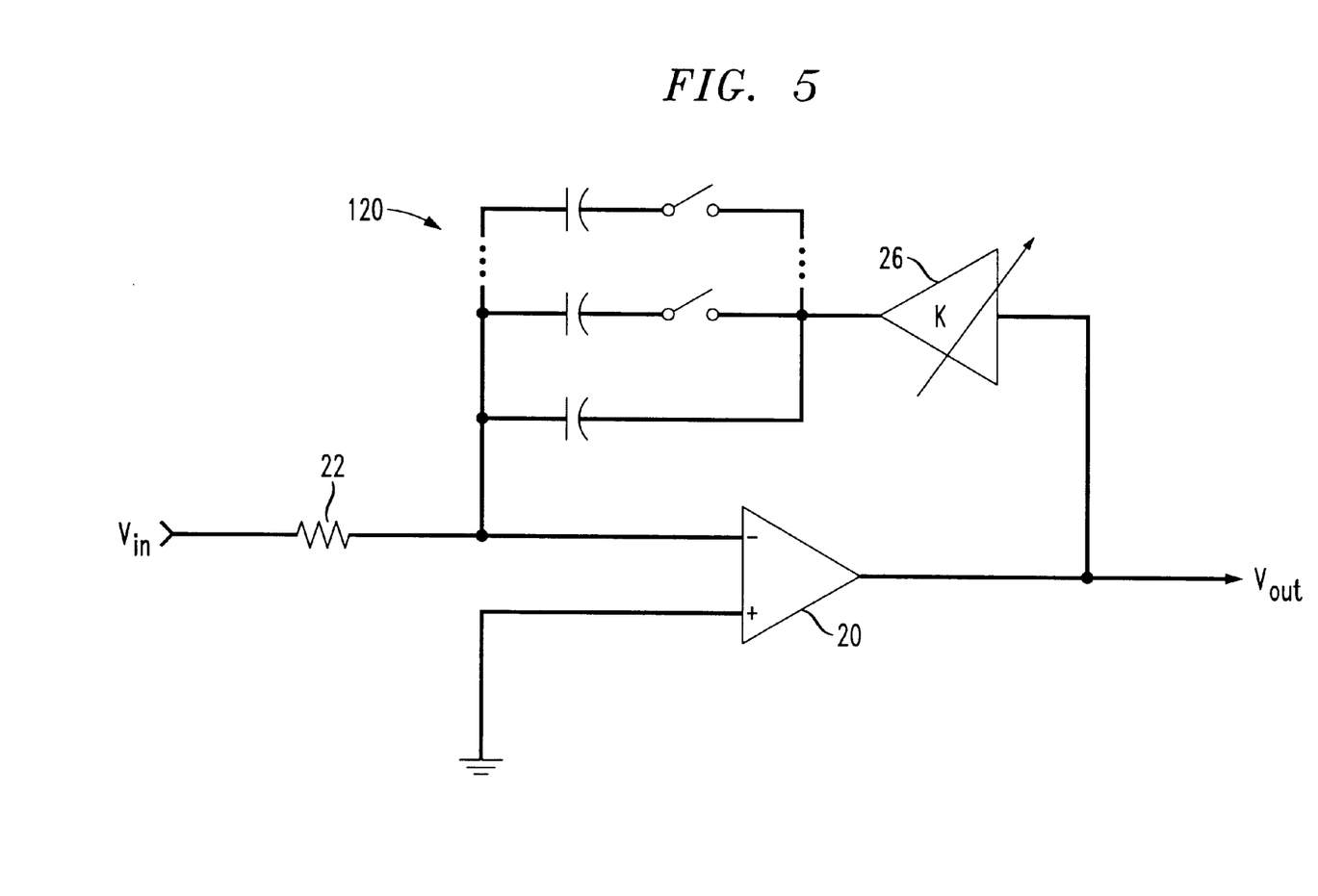
FIG. 5 is a schematic diagram of a hybrid circuit combining the preset invention with a capacitor array.

A hybrid embodiment combining the preset invention with a capacitor array is shown in FIG. 5. In this embodiment, the feedback capacitor 24 of FIG. 1 is replaced with a capacitor array 120. This arrangement has a tuning amplifier 26 which does not need to compensate for the full +/–50% variation in the RC product. Instead, the gain of the tuning amplifier 26 is adjusted to compensate for the process variations of the resistances. Then, the capacitor arrays are set to accommodate for process variations in the capacitor. Since the capacitor process variations are typically small, with some processes achieving a tolerance of less than +/–10%, the capacitor arrays can also be much smaller than those used in conventional R-C Array filters which must be large enough to be tuned to compensate for variations in both R and C. Furthermore, since the capacitance of the array varies only slightly with variations in temperature, the array itself will generally only need to be tuned once. After the capacitor array 120 is tuned, filter tuning to compensate for variations in resistance due to process and/or temperature may be automatically performed with or without a driving signal $V_{in}$ present in the filter. In contrast, on-line tuning is not possible while calibrating a capacitor array in an R-C Array filter. The hybrid integrator as discussed here may also be used to form programmable filters by using large capacitor arrays that can be programmed to obtain different frequency responses in a single filter.

Regardless of which embodiment is selected for the tuning amplifier 26 and the method of adjusting its gain to tune the filter 10, the presence of two amplifiers in a series feedback loop makes it necessary to consider stability of the circuit when designing the tuning amplifier 26. The first order stability analysis of the capacitor-tuner integrator 10 is very similar to the stability analysis of a phase-lead integrator. See, e.g, K. Martin and A. S. Sedra, "On the Stability of the Phase-Lead Integrator," IEEE Trans. Circuits Syst., Vol. CAS-24, pp. 321–324, June, 1977. However, the stability analysis for the capacitor tuner integrator of the present invention is more general. One reason for this is the gain of the tuning amplifier 26 is variable, ranging, in one embodiment, from about 0.5 to 1.5 to compensate for RC process variations. In contrast, a phase-lead integrator requires a constant feedback amplifier gain of less than or equal to 1. Another reason is that the present invention may be used as a tunable capacitor multiplier to increase the effective RC constant, and therefore the gain of the tuning amplifier may be higher than 1.5, i.e., the amplifier gain may be tunable by about +/–50% percent around a center value greater than 1. Because mathematical analysis, such as is discussed by Martin and Sedra, is often not very insightful and becomes complicated when a higher-order system is analyzed, stability of the capacitor-tuner/multiplier integrator according to the present invention is discussed herein using graphical techniques, and with reference to the graphs in FIGS. 6 and 7.

Figure 6A:
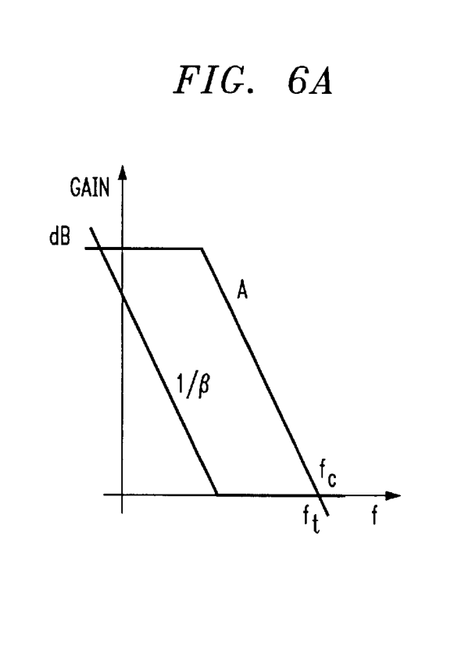
FIG. 6a is a graph of the open-loop gain A and the inverse of the feedback factor β of a conventional integrator with a single-pole op-amp.
Figure 6B:
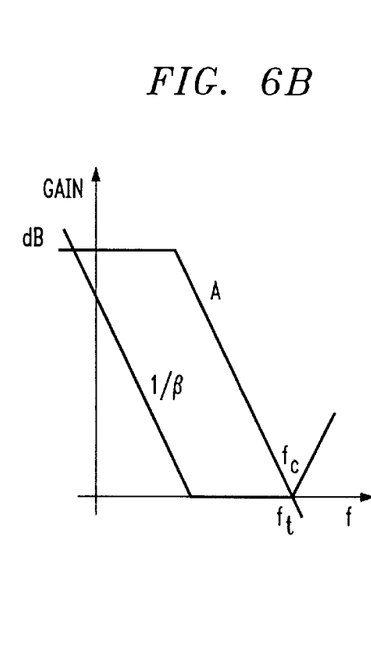
FIG. 6b is a graph of A versus 1/β for an integrator with a unity gain feedback amplifier, where the feedback and the main amplifiers are identical single-pole op-amps.
Figure 6C:
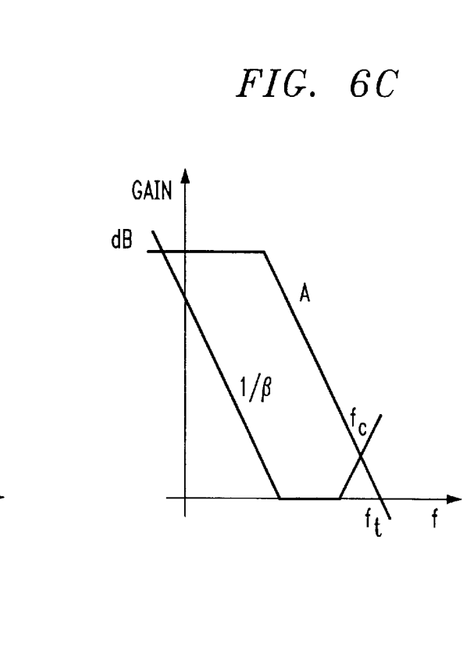
FIG. 6c is a graph of A versus 1/β with where the gain of the feedback amplifier is increased and where the feedback and the main amplifiers are identical single-pole op-amps.

FIG. 6a is a graph of the open-loop gain A and the inverse of the feedback factor β of a conventional integrator with a single-pole op-amp where $f_t$ is the unity gain frequency of the main amplifier (where A crosses the x-axis) and $f_c$ is the point where the 1/β and A curves cross. This configuration is stable because the rate of closure is about 20 dB/dec, i.e., the phase margin is about 90 degrees at the unity gain frequency, $f_t$. FIG. 6b is a graph of A versus 1/β for an integrator with a unity gain feedback amplifier, where the feedback and the main amplifiers are identical single-pole op-amps, such as in conventional phase-lead integrators. In theory, the phase margin at $f_t$ (also $f_c$) is 45 degrees and the circuit is stable. However, the circuit is on the verge of instability and any increase in the gain of the feedback amplifier may create an unstable circuit. FIG. 6c is a graph of A versus 1/β where the gain of the feedback amplifier is increased and where the feedback and the main amplifiers are identical single-pole op-amps. Increasing the gain of the feedback amplifier lowers its 3 dB frequency. As a result, the feedback factor 1/β will be greater than one before the open-loop gain crosses the x-axis, as shown. The phase margin at $f_c$ is about 0 degrees and the integrator is unstable. Accordingly, the circuit of the present invention is stable when the bandwidth of the tuning amplifier 26 is greater than that of the main amplifier 20. In other words, the phase margin at $f_c$, where A and 1/β cross, should be greater than zero.

Figure 7A:
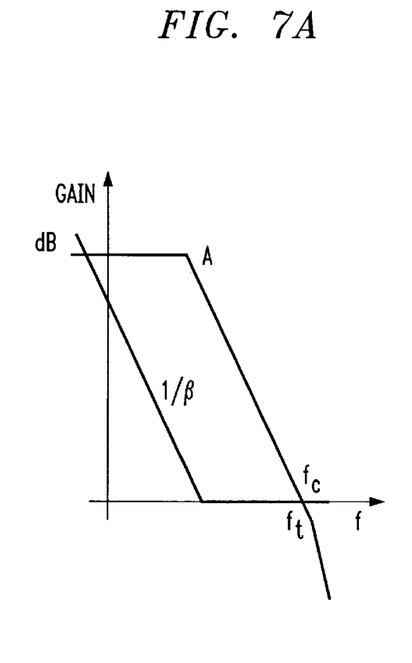
FIG. 7a is a graph of A versus 1/β of a conventional integrator with a two-pole op-amp.
Figure 7B:
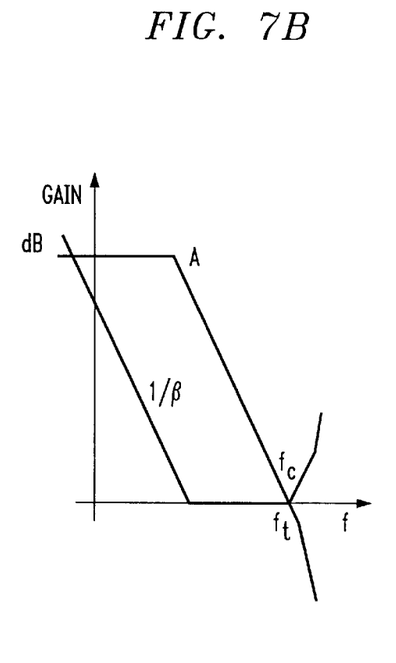
FIG. 7b is a graph of A versus 1/β for an integrator with a unity gain feedback amplifier, where the feedback and the main amplifiers are identical two-pole op-amps.

Practical op-amps are described better by two-pole models. FIG. 7a shows an open-loop gain vs. the inverse feedback of a conventional integrator with a two-pole op-amp. The second pole contributes additional phase shift but the integrator is still stable because β is one at the unity-gain frequency. FIG. 7b shows A versus 1/β for an integrator with a unity gain feedback amplifier, and where the main and feedback amplifiers are two identical two-pole amplifiers. Additional phase shift caused by the second poles of both op-amps degrades the phase margin of the integrator, and it can become unstable when the gain of the tuning amplifier is increased, as discussed above.

Figure 7C:
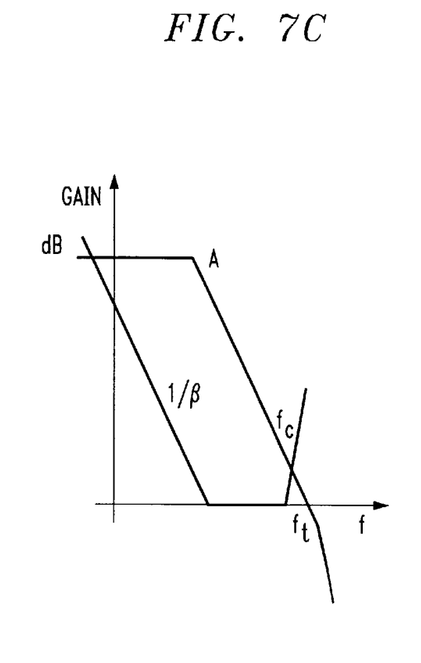
FIG. 7c is a graph of A versus 1/β for a non-inverting integrator of FIG. 3.

FIG. 7c is a graph of A vs. 1/β for a non-inverting integrator according to the present invention, as shown in FIG. 3. The feedback resistors, $R_1$ and $R_2$, combined with the input capacitance of the feedback (i.e., tuning) amplifier produce a pole which may cause instability. Accordingly, the resistances of the feedback amplifier must be chosen so that the effect of this pole is outside the unity gain bandwidth. This can be achieved by using small resistors and minimizing the size of the input stage of the feedback amplifier.

It should be noted, however, that using small resistances also increases the power requirements for the tuning amplifier. If the resistances are too small, the tuning amplifier will need to drive so much power that it can no longer be made simple in comparison to the main filter amplifier, thus making it more difficult to design the tuning filter to have a bandwidth greater than that of the main amplifier.

When the tuning amplifier 26 is used to multiply the effective capacitance, the bandwidth of the tuning amplifier must be increased beyond that required for an amplifier used only for tuning. As will be apparent to those of skill in the art, the greater the gain of the tuning amplifier 26, the greater its bandwidth must be relative to the main amplifier 20 to keep the circuit stable.

Finally, a further advantage of the capacitor-tuner integrator according to the present invention is that the tuning amplifier improves the quality factor, Q, in a manner similar to that seen in phase-lead integrators. The quality factor for an integrator according to the present invention is given by:

$$Q = \frac{wt_2/w}{1 - wt_2/wt_1} \quad \text{(Equ. 3)}$$

where $wt_2$ and $wt_1$ correspond to the unity gain bandwidth of the main and tuning amplifiers respectively. See, e.g, Schaumann, Ghausi, and Laker, "Design of Analog Filters," Chp. 4, Prentice Hall, Englewood Cliffs. 1990.

From Equation 3, it can be seen that Q will approach infinity if the unity gain bandwidth of the two amplifiers is perfectly matched. Since, according to the present invention, the bandwidth of the tuning amplifier is larger than that of the main amplifier so that the circuit is stable, the amplifiers cannot be identical. However, if the bandwidth of the tuning amplifier is large compared to that of the main amplifier, Equation 3 reduces to $Q = wt_2/w$, the equation for a conventional integrator.

It should be noted that Equation 3 is derived for the case of a unity gain feedback amplifier, which corresponds to the case when the tuning amplifier 26 is used only to tune the filter (i.e., has a gain in the range of 0.5 to 1.5) and not as a tunable capacitor multiplier. However, a similar analysis may be performed for this situation, as will be apparent to those skilled in the art.

I claim:

1. A tunable integrator circuit comprising:
   a main amplifier;
   a resistor connected to an input of said main amplifier;
   a tuning amplifier having a variable gain and being driven by an output of said main amplifier, said tuning amplifier having a bandwidth which is greater than a bandwidth of said main amplifier; and
   a capacitor connected between the output of said tuning amplifier and the input of said main amplifier.

2. The circuit of claim 1, wherein said tuning amplifier comprises:
   an operational amplifier;
   a first resistor connected between the output of said operational amplifier and the inverting input of said operational amplifier; and
   a second resistor connected between the inverting input of said operational amplifier and the output of said main amplifier; wherein the resistance of at least one of said first and second resistors is variable.

3. The circuit of claim 2, wherein the resistance of said variable resistor is controlled by an applied reference voltage.

4. The circuit of claim 3 wherein said variable resistor is a MOS transistor having a gate voltage.

5. The circuit of claim 1, wherein said tuning amplifier comprises:
   an operational amplifier having an inverted and a non-inverted output and an inverting and a non-inverting input;
   a first input resistor connected to said inverting input;
   a second input resistor connected to said non-inverting input;
   a first output resistor connected to said inverted output;
   a second output resistor connected to said non-inverted output;
   a first MOS transistor connected between said first output resistor and said inverting input;
   a second MOS transistor connected between said first output resistor and said non-inverting input;
   a third MOS transistor connected between said second output resistor and said inverting input; and
   a fourth MOS transistor connected between said second output resistor and said non-inverting input; wherein
   the gate of said first transistor is connected to the gate of said fourth transistor;
   the gate of said second transistor is connected to the gate of said third transistor; and
   the gain of said tuning amplifier is determined by a reference voltage applied between said connected first and fourth transistor gates and said connected second and third transistor gates.

6. An integrated circuit that includes a tunable integrator, said tunable integrator comprising:
   a main amplifier;
   a resistor connected to an input of said main amplifier;
   a tuning amplifier having variable gain and being driven by an output of said main amplifier, said tuning amplifier having a bandwidth which is greater than a bandwidth of said main amplifier; and
   a capacitor connected between the output of said tuning amplifier and the input of said main amplifier.

7. The integrated circuit of claim 6, wherein said capacitor comprises a capacitor array.

8. An integrated circuit that includes a capacitor tunable integrator, said integrator having an effective capacitance and comprising:
   a main amplifier;
   a resistor connected to an input of said main amplifier;
   a tuning amplifier having variable gain greater than one and being driven by an output of said main amplifier, said tuning amplifier having a bandwidth which is greater than a bandwidth of said main amplifier; and
   a capacitor connected between the output of said tuning amplifier and the input of said main amplifier and having a particular capacitance; wherein
   the effective capacitance of said integrator is larger then the particular capacitance of said capacitor.

9. The integrated circuit of claim 8, wherein the gain of said tuning amplifier is variable by about fifty percent about a center gain value greater than one.

* * * * *